US007915950B2

(12) United States Patent
Rosik et al.

(10) Patent No.: US 7,915,950 B2
(45) Date of Patent: Mar. 29, 2011

(54) METHOD AND ALGORITHM OF HIGH PRECISION ON-CHIP GLOBAL BIASING USING INTEGRATED RESISTOR CALIBRATION CIRCUITS

(75) Inventors: Ray Rosik, San Diego, CA (US); Weinan Gao, San Diego, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 365 days.

(21) Appl. No.: 12/143,546

(22) Filed: Jun. 20, 2008

(65) Prior Publication Data

US 2009/0315617 A1 Dec. 24, 2009

(51) Int. Cl.
*G11C 5/14* (2006.01)

(52) U.S. Cl. ........................................ 327/530; 324/202

(58) Field of Classification Search .................. 327/530; 324/202

See application file for complete search history.

(56) References Cited

U.S. PATENT DOCUMENTS

| | | | | |
|---|---|---|---|---|
| 5,359,301 | A | 10/1994 | Candage | |
| 5,568,084 | A | 10/1996 | McClure et al. | |
| 5,640,122 | A | 6/1997 | McClure | |
| 5,955,911 | A | 9/1999 | Drost et al. | |
| 6,762,624 | B2 | 7/2004 | Lai | |
| 6,940,294 | B2 | 9/2005 | Eberlein | |
| 6,975,160 | B2 * | 12/2005 | Garrett et al. | 327/535 |
| 7,154,325 | B2 | 12/2006 | La Rosa | |

* cited by examiner

*Primary Examiner* — Lincoln Donovan
*Assistant Examiner* — Daniel Rojas

(57) ABSTRACT

Systems and methods for providing bias currents to multiple analog circuits are disclosed. An integrated circuit comprises a calibration circuit which compares a high tolerance external component to a plurality of internal components manufactured to span the variability of the process, voltage and temperature. The best fitting internal component is communicated to bias circuits which can select an internal component from a local plurality of internal components with matching desired characteristics. In this manner, analog circuits can be locally biased with the tolerance usually associated with a high tolerance external reference component, without the necessity for a local external reference component.

18 Claims, 13 Drawing Sheets

| | $V_{in}$ | ADC <5:0> | hex |
|---|---|---|---|
| 0 | 0.68 | 0 0 0 0 0 0 | 0 |
| 1 | 0.69 | 0 0 0 0 0 1 | 1 |
| 2 | 0.70 | 0 0 0 0 1 0 | 2 |
| 3 | 0.71 | 0 0 0 0 1 1 | 3 |
| 4 | 0.72 | 0 0 0 1 0 0 | 4 |
| 5 | 0.73 | 0 0 0 1 0 1 | 5 |
| 6 | 0.74 | 0 0 0 1 1 0 | 6 |
| 7 | 0.75 | 0 0 0 1 1 1 | 7 |
| 8 | 0.76 | 0 0 1 0 0 0 | 8 |
| 9 | 0.77 | 0 0 1 0 0 1 | 9 |
| 10 | 0.78 | 0 0 1 0 1 0 | A |
| 11 | 0.79 | 0 0 1 0 1 1 | B |
| 12 | 0.80 | 0 0 1 1 0 0 | C |
| 13 | 0.81 | 0 0 1 1 0 1 | D |
| 14 | 0.82 | 0 0 1 1 1 0 | E |
| 15 | 0.83 | 0 0 1 1 1 1 | F |
| 16 | 0.84 | 0 1 0 0 0 0 | 10 |
| 17 | 0.85 | 0 1 0 0 0 1 | 11 |
| 18 | 0.86 | 0 1 0 0 1 0 | 12 |
| 19 | 0.87 | 0 1 0 0 1 1 | 13 |
| 20 | 0.88 | 0 1 0 1 0 0 | 14 |
| 21 | 0.89 | 0 1 0 1 0 1 | 15 |
| 22 | 0.90 | 0 1 0 1 1 0 | 16 |
| 23 | 0.91 | 0 1 0 1 1 1 | 17 |
| 24 | 0.92 | 0 1 1 0 0 0 | 18 |
| 25 | 0.93 | 0 1 1 0 0 1 | 19 |
| 26 | 0.94 | 0 1 1 0 1 0 | 1A |
| 27 | 0.95 | 0 1 1 0 1 1 | 1B |
| 28 | 0.96 | 0 1 1 1 0 0 | 1C |
| 29 | 0.97 | 0 1 1 1 0 1 | 1D |
| 30 | 0.98 | 0 1 1 1 1 0 | 1E |
| 31 | 0.99 | 0 1 1 1 1 1 | 1F |

| | $V_{in}$ | ADC <5:0> | hex |
|---|---|---|---|
| 32 | 1.00V | 1 0 0 0 0 0 | 20 |
| 33 | 1.01 | 1 0 0 0 0 1 | 21 |
| 34 | 1.02 | 1 0 0 0 1 0 | 22 |
| 35 | 1.03 | 1 0 0 0 1 1 | 23 |
| 36 | 1.04 | 1 0 0 1 0 0 | 24 |
| 37 | 1.05 | 1 0 0 1 0 1 | 25 |
| 38 | 1.06 | 1 0 0 1 1 0 | 26 |
| 39 | 1.07 | 1 0 0 1 1 1 | 27 |
| 40 | 1.08 | 1 0 1 0 0 0 | 28 |
| 41 | 1.09 | 1 0 1 0 0 1 | 29 |
| 42 | 1.10 | 1 0 1 0 1 0 | 2A |
| 43 | 1.11 | 1 0 1 0 1 1 | 2B |
| 44 | 1.12 | 1 0 1 1 0 0 | 2C |
| 45 | 1.13 | 1 0 1 1 0 1 | 2D |
| 46 | 1.14 | 1 0 1 1 1 0 | 2E |
| 47 | 1.15 | 1 0 1 1 1 1 | 2F |
| 48 | 1.16 | 1 1 0 0 0 0 | 30 |
| 49 | 1.17 | 1 1 0 0 0 1 | 31 |
| 50 | 1.18 | 1 1 0 0 1 0 | 32 |
| 51 | 1.19 | 1 1 0 0 1 1 | 33 |
| 52 | 1.20 | 1 1 0 1 0 0 | 34 |
| 53 | 1.21 | 1 1 0 1 0 1 | 35 |
| 54 | 1.22 | 1 1 0 1 1 0 | 36 |
| 55 | 1.23 | 1 1 0 1 1 1 | 37 |
| 56 | 1.24 | 1 1 1 0 0 0 | 38 |
| 57 | 1.25 | 1 1 1 0 0 1 | 39 |
| 58 | 1.26 | 1 1 1 0 1 0 | 3A |
| 59 | 1.27 | 1 1 1 0 1 1 | 3B |
| 60 | 1.28 | 1 1 1 1 0 0 | 3C |
| 61 | 1.29 | 1 1 1 1 0 1 | 3D |
| 62 | 1.30 | 1 1 1 1 1 0 | 3E |
| 63 | 1.31 | 1 1 1 1 1 1 | 3F |

FIG. 11

RPolyH CAL_GB<3:0> decoder table

| | RPolyH CAL_GB<3> | RPolyH CAL_GB<2> | RPolyH CAL_GB<1> | RPolyH CAL_GB<0> | Measured sheet R | Compensating bias resistance $R_b$ |
|---|---|---|---|---|---|---|
| 0 | 0 | 0 | 0 | 0 | RPolyH ρ= -12% | $R_b$ = +12% |
| 1 | 0 | 0 | 0 | 1 | RPolyH ρ= -9% | $R_b$ = +9% |
| 2 | 0 | 0 | 1 | 0 | RPolyH ρ= -6% | $R_b$ = +6% |
| 3 | 0 | 0 | 1 | 1 | RPolyH ρ= -3% | $R_b$ = +3% |
| 4 | 0 | 1 | 0 | 0 | RPolyH ρ= NOM | $R_b$ = NOM |
| 5 | 0 | 1 | 0 | 1 | RPolyH ρ= +3% | $R_b$ = -3% |
| 6 | 0 | 1 | 1 | 0 | RPolyH ρ= +6% | $R_b$ = -6% |
| 7 | 0 | 1 | 1 | 1 | RPolyH ρ= +9% | $R_b$ = -9% |
| 8 | 1 | 0 | 0 | 0 | RPolyH ρ= +12% | $R_b$ = -12% |
| 9 | 1 | 0 | 0 | 1 | X | X |
| 10 | 1 | 0 | 1 | 0 | X | X |
| 11 | 1 | 0 | 1 | 1 | X | X |
| 12 | 1 | 1 | 0 | 0 | X | X |
| 13 | 1 | 1 | 0 | 1 | X | X |
| 14 | 1 | 1 | 1 | 0 | X | X |
| 15 | 1 | 1 | 1 | 1 | X | X |

FIG. 13

METHOD AND ALGORITHM OF HIGH PRECISION ON-CHIP GLOBAL BIASING USING INTEGRATED RESISTOR CALIBRATION CIRCUITS

BACKGROUND OF THE INVENTION

1. Field of the Inventions

The present invention relates to bias circuits and specifically to global biasing circuits using resistor calibration circuits.

2. Background Information

Low power dissipation is extremely critical for many applications for radio frequency (RF) and analog integrated circuits. These applications include battery powered devices, universal serial bus (USB) compatible devices, and even set top box products. Lower power solutions extend battery life and allow more functionality to be integrated into smaller packages for highly integrated products. The term integrated circuit (IC) is often used interchangeable with the term "chip."

Many low power solutions address the issue of power consumption with new circuit topologies that offer similar performance with reduced current consumption. While some variation is expected from the off-chip supply voltage, the current consumption under nominal process conditions sets the nominal power dissipation. However, the power budget for IC products is nearly always based upon a worst case power budget. The worst case power is a function of process, voltage, and temperature variations within the chip under the specified range of operating conditions.

Almost all analog and RF circuits use a bias circuit as a supply independent reference to generate bias voltages or currents. The supply independent nature of these reference circuits eliminates variation in the overall current consumption due to variation in the supply voltage. Conceptually, bias currents essentially operate by using a reference voltage which is fixed to a physical characteristic such as the bandgap voltage of a transistor and converting it to a current using a resistor in accordance with Ohm's law. As the current consumption variation due to supply voltage is eliminated, the remaining significant source of current variation is in the variability of the resistors in the bias circuits. Unfortunately, the tolerances of on-chip resistors are very great due to process variations. These resistors can have tolerances as large as +/−15% in a typical silicon process. Since the bias currents are often directly proportional to these resistances, this variation results in as much as 15% additional power dissipation under worst case conditions due just to the tolerances of the resistors. For example, a silicon tuner with a nominal power dissipation of 1.5 W, may have worst case power dissipation as high as 1.725 W. The result is an additional power penalty of 225 mW that must be built into the power budget for the chip to cover worst case operating conditions. The additional 225 mW is higher than the individual nominal power dissipation of many of the most power hungry circuits on the chip.

While the tolerance of on-chip resistors is limited by process variation to the range of 10-15%, off-chip resistors are typically available with much tighter tolerances. Therefore, it is desirable for the on-chip bias circuits to reference high precision, off-chip resistors whenever possible. This poses problems for highly integrated RF or analog integrated circuits which typically use many different custom bias circuits in multiple separate supply domains. Referencing any bias circuit to an off-chip resistor requires a designated package pin for each individual resistor. Package pins are often very limited and are used mainly for power supplies and I/O pins.

Therefore, the number of high precision, off-chip resistors that can be used for separate, local bias circuits is very limited. Additional off-chip resistors also add to the bill of materials (BOM) for the IC product which increases the cost.

There are several strategies commonly used in the past for global biasing using integrated resistors in RF or analog integrated circuits. The first approach is to use a single common shared global bias circuit. FIG. 1 shows an integrated circuit with a shared, common global bias circuit. With this approach, there is one common bias circuit that feeds all the analog circuits within the chip by feeding either a bias current or a bias voltage to each analog circuit in their individual supply domains. Distribution of bias currents is most commonly used since the currents are less sensitive to picking up common mode noise; however, bias voltages can be used as well. Common global bias circuits offer the advantage of one, high precision bias circuit that can be generated by using one off-chip high precision resistor. In this way, tolerance on the bias currents as good as +/−1% is easily achievable at the cost of only one designated package pin and one off-chip high precision resistor.

Unfortunately, the common global bias approach suffers from the drawback that that the common global bias circuit allows spurs and noise to couple through the bias circuit from noisy analog circuits, like the crystal oscillator, to very sensitive circuits like the low noise amplifier (LNA). Coupling can occur though the shared supply voltage ($V_{CC}$). Coupling also is very likely to occur through the metal routing used to carry bias currents from the global bias circuit to each individual analog circuit. The metal routing for the bias currents originating from one common global bias on any highly integrated RF or analog ICs will typically span several hundred microns. This routing may be required to pass near many different circuits where it can pick up noise at any point along the way. For example, in FIG. 1, analog circuit 102 could be a crystal oscillator and analog circuit 106 could be an LNA. Noise introduced by analog circuit 102 could travel to analog circuit 106 through the $I_{bias1}$ and $I_{bias3}$ lines through global current bias circuit 110. Therefore, the common global bias approach is extremely prone to spreading noise around the chip and limiting the performance of sensitive analog circuits.

Another drawback suffered by the common global bias approach is that the bias circuit cannot be optimized for design constraints of all analog circuits simultaneously. Each analog circuit has a different preferred topology to optimize the performance of that individual block. Some analog circuits are very sensitive to 1/f noise, such as a crystal oscillator or the charge pump in a phase-locked loop for example. In other analog circuits, the thermal noise floor established by the bias circuit is the most critical such as in a LNA or RF mixer. Also, the temperature coefficient (TC) requirements may vary for different analog circuits. Some analog circuits require a proportional to absolute temperature (PTAT) current, while others require a bandgap (BG) current with flat TC. A common global bias circuit optimized for one set of individual performance requirements of one analog circuit would likely produce suboptimal performance in another analog circuit having different performance requirements. Common global biasing with one circuit prevents optimization of the bias for individual performance requirements of any one analog circuit. Therefore, the performance of the individual analog circuits generally cannot be fully optimized and may not even meet the required specifications.

A second global biasing approach is to use individual bias circuits, optimized for each individual analog circuit block. A block diagram of this approach is illustrated in FIG. 2. This is the biasing scheme used on many silicon tuners. With the individual biasing scheme, the biasing for each of the analog circuit blocks is optimized separately for the very best performance. The bias circuits, for example, include PTAT bias circuits, band gap referenced bias circuits, and a low 1/f noise Widlar-based bias circuit. The main drawback to this approach is the large process variation of the on-chip resistors. For example, analog circuit 222 could be coupled to bias circuit 202 which may be a PTAT bias circuit and analog circuit 224 could be coupled to bias circuit 204 which may be a band gap referenced bias circuit whereas bias circuit 206 could be a low 1/f noise Widlar-biased bias circuit which is coupled to 1/f noise sensitive analog circuit 226. In this manner, bias circuits can be optimized for the best performance of the coupled analog circuit.

However, with many separate bias circuits, it becomes impractical to use off-chip resistors for each one due to the limited number of pins on the IC package. Therefore, the bias currents are generated with reference to on-chip resistors and result in large process variation as high at +/−15% in a typical silicon IC process technology. This adds potentially 15% to the current consumption and 15% to the power dissipation of the full chip. For example, a +15% lower on-chip sheet resistance for a 1.5 W silicon tuner nominally consuming 430 mA can consume up to 495 mA. This represents an extra 65 mA of current and 215 mW higher power dissipation. The extra 65 mA is comparable to adding an additional analog circuit with significant current consumption to the die.

A third approach represents a hybrid to the two previous approaches where a combination of an on-chip resistor referenced bias circuits and an off-chip, high precision resistor referenced bias circuits. This scheme is also popular for many RF and analog integrated circuits. The variation in the global current dissipation is reduced since a few of the bias circuits are referenced to the off-chip resistor. Each analog circuit can have its own separate bias circuit fully optimized for the performance of that particular circuit. At the same time, one or two off-chip resistors can help tighten the current tolerance on a few of the most power hungry blocks on the chip, thereby minimizing the power consumption of the whole chip.

FIG. 3 depicts an example of the hybrid biasing approach. Analog circuits 322, 324, 326, 328, 330, and 332 are coupled to corresponding bias circuits 302, 304, 306, 308, 310, and 312, respectively. In this example, analog circuits 322, 324, and 330 are particularly power hungry circuits, so their corresponding bias circuits 302, 304 and 310 use high precision off-chip reference resistors 350, 352, and 354, respectively, to reference the circuits.

Though this approach offers some of the advantages of the other approaches, there are some disadvantages as well. The first disadvantage is that most of the analog circuits on the full chip are still referenced to on-chip resistors, with the exception of a very few circuits where the high precision off-chip resistors are used. The number of these circuits is limited by the package pins that are free to allocate to these bias circuits. Another disadvantage is that the bias circuit referenced to the off-chip resistor directly feeds one or more sensitive analog circuits. In this way, the bond wire, package pin, and metal routing used to connect the external resistance can pick up noise within the chip, within the package or on the printed circuit board (PCB) and spread it to the circuits which use the bias currents. Noise may also arise in highly integrated chips due to the floor plan when external resistors are used for biasing. The floor plan often requires that one or more analog circuits be placed in the center of the chip. For those circuits, metal traces to connect an off-chip resistor must be routed close to other potentially noisy circuits to reach the pad ring on the perimeter of the die. As an example, in a silicon tuner, the baseband amplifiers might be located in the center of the die, and they are referenced to an off-chip resistor. The traces to connect the bias circuit to the pad ring for the external resistor are routed by the voltage controlled oscillators (VCO) inductors. The inductors carry high currents and can easily induce a voltage on the metal traces, disturbing the value of the bias currents. This change in bias current can easily affect the gain and other performance of the analog baseband circuits.

Given these constraints, there is a considerable need for a circuit and method of referencing the on-chip bias circuits to one high precision off-chip resistor using only one designated package pin. Further, there is considerable motivation for a circuit and method of distributing a higher precision resistance globally across the IC without picking up common mode noise and spreading it from a noisy circuit to a sensitive one. Accordingly, various needs exist in the industry to address the aforementioned deficiencies and inadequacies.

SUMMARY OF INVENTION

An integrated circuit is disclosed, having a calibration circuit having a plurality of internal components and an analog circuit also having a plurality of internal components. The calibration circuit compares an external reference to the plurality of internal components to find the best matching internal component. Once a best match is found, the calibration circuit communicates this best match to the analog circuit which can then select locally the corresponding internal component in the plurality of internal components. The references can be resistors which are commonly used to provide reference for a bias current source. The internal resistors are often fabricated from polysilicon and can be of the high sheet resistance or low sheet resistance variety. In a variation, the calibration circuit can include providing references for multiple component types (such as high sheet resistance polysilicon resistors and low sheet resistance polysilicon resistors). The calibration circuit itself can comprise a programmable current bias circuit, an analog-to-digital converter, and a digital state engine. The programmable current bias circuit can comprise the plurality of internal components with a switch coupled to each of the internal components, a digital decoder coupled to and controlling the switches, a bandgap voltage reference, a buffer and a current mirror.

A method for calibration is also disclosed comprising powering-up the integrating circuit and waiting for the integrated circuit to reach an equilibrium, comparing an external component to each of a plurality of internal components in a calibration circuit, selecting a matching component in the first plurality of internal components, transmitting a label representative of the matching component to each analog circuit, using a component corresponding to the matching component in each analog circuit, latching the label and powering down the calibration circuit.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 11 shows an example mapping table for the 6-bit analog-to-digital converter (ADC);

FIG. 13 shows an example decoder mapping table for each local bias circuit.

DETAILED DESCRIPTION

While components such as resistors can have significant variations due to process, supply voltage and temperature (PVT), on-chip these components tend to be consistent. For instance, a resistor specified as 10-kΩ may in fact be a 10.5-kΩ resistor due to PVT. However, all resistors specified as 10-kΩ would tend to be around 10.5-kΩ resistors on the same chip. While PVT variations can have a significant impact on the tolerances of many components, the variations tend to affect like components in the same way.

Figure 1:
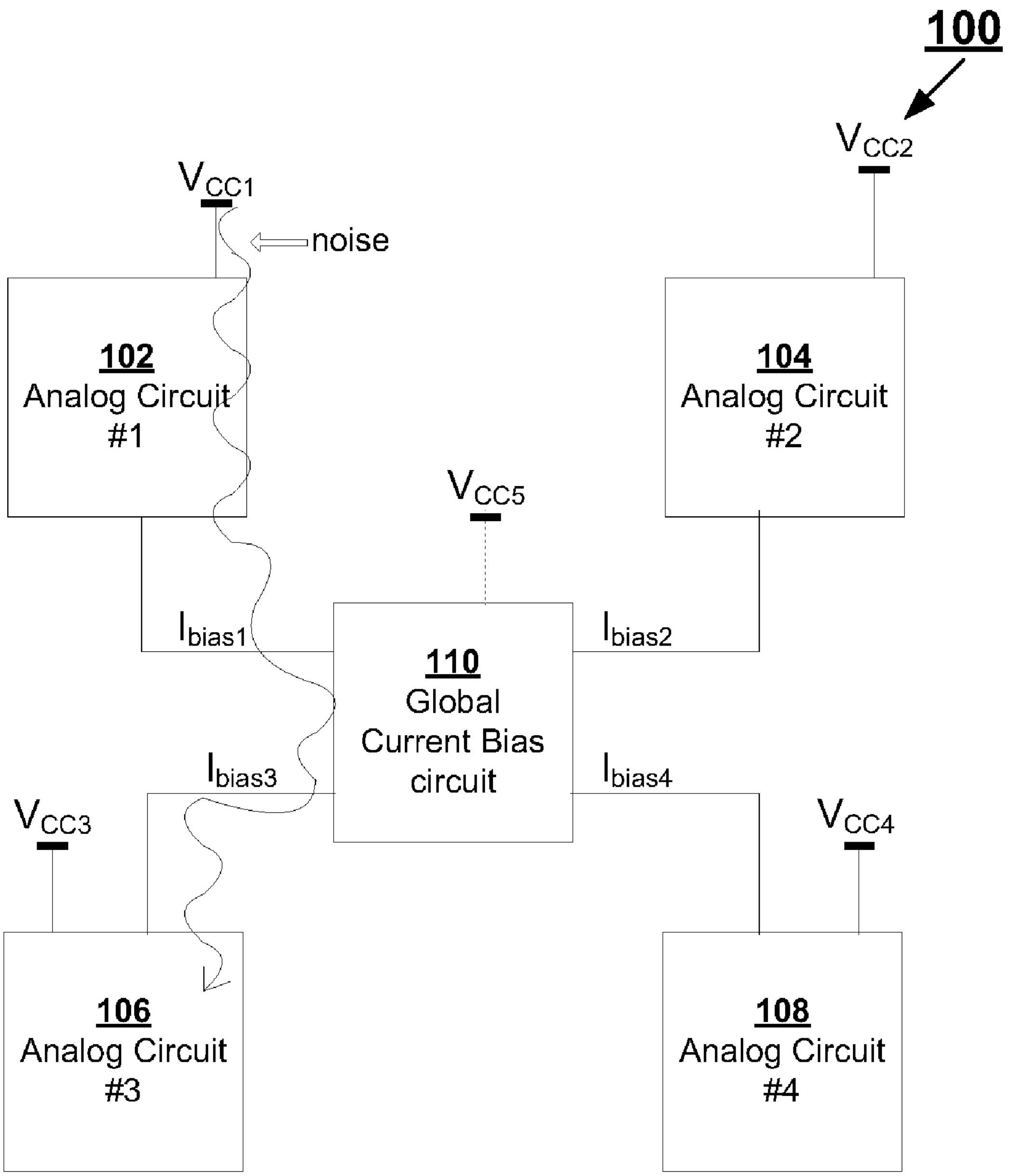
FIG. 1 (Prior Art)
FIG. 1 shows an integrated circuit with a shared, common global bias circuit.
Figure 2:
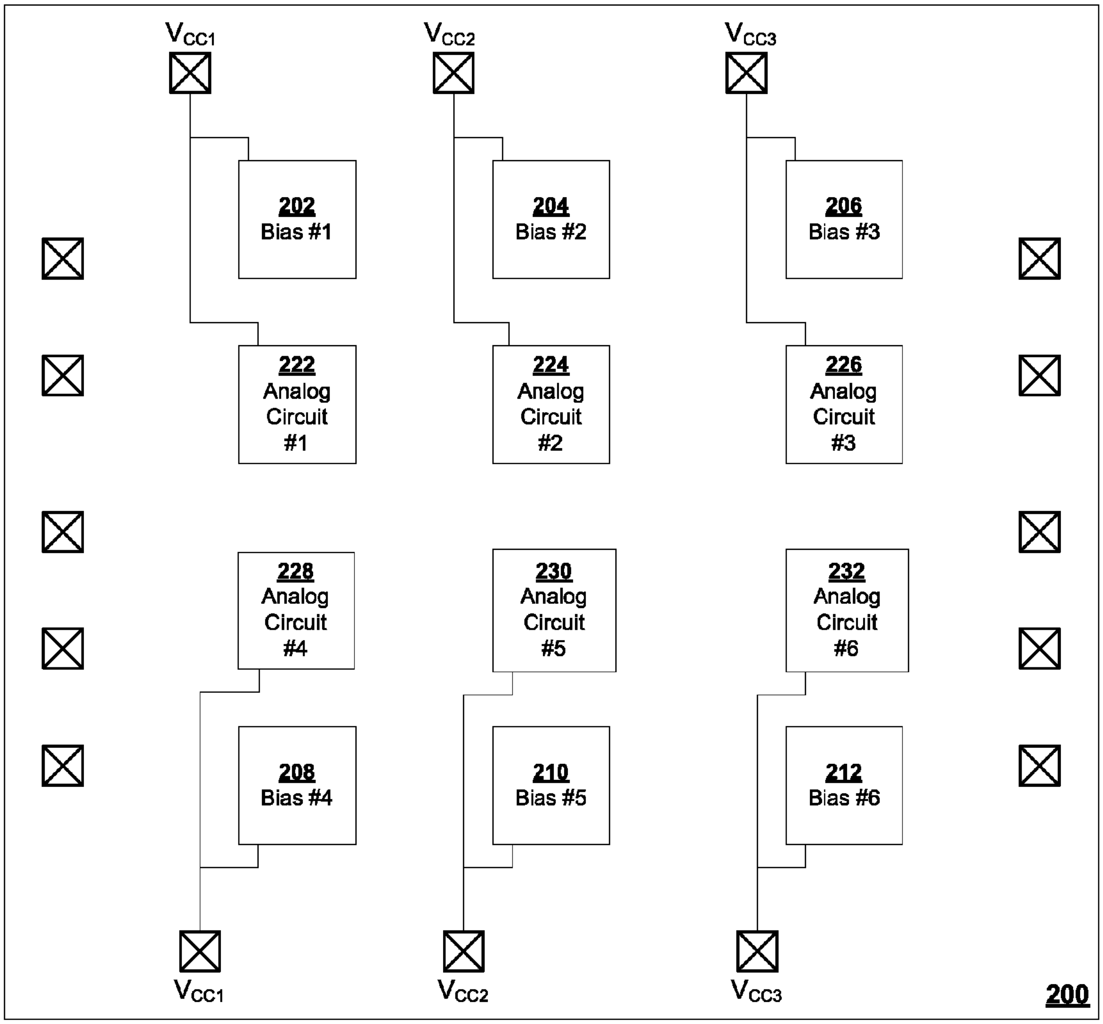
FIG. 2 (Prior Art)
FIG. 2 shows an integrated circuit with individual bias circuits optimized for each individual analog circuit block.
Figure 3:
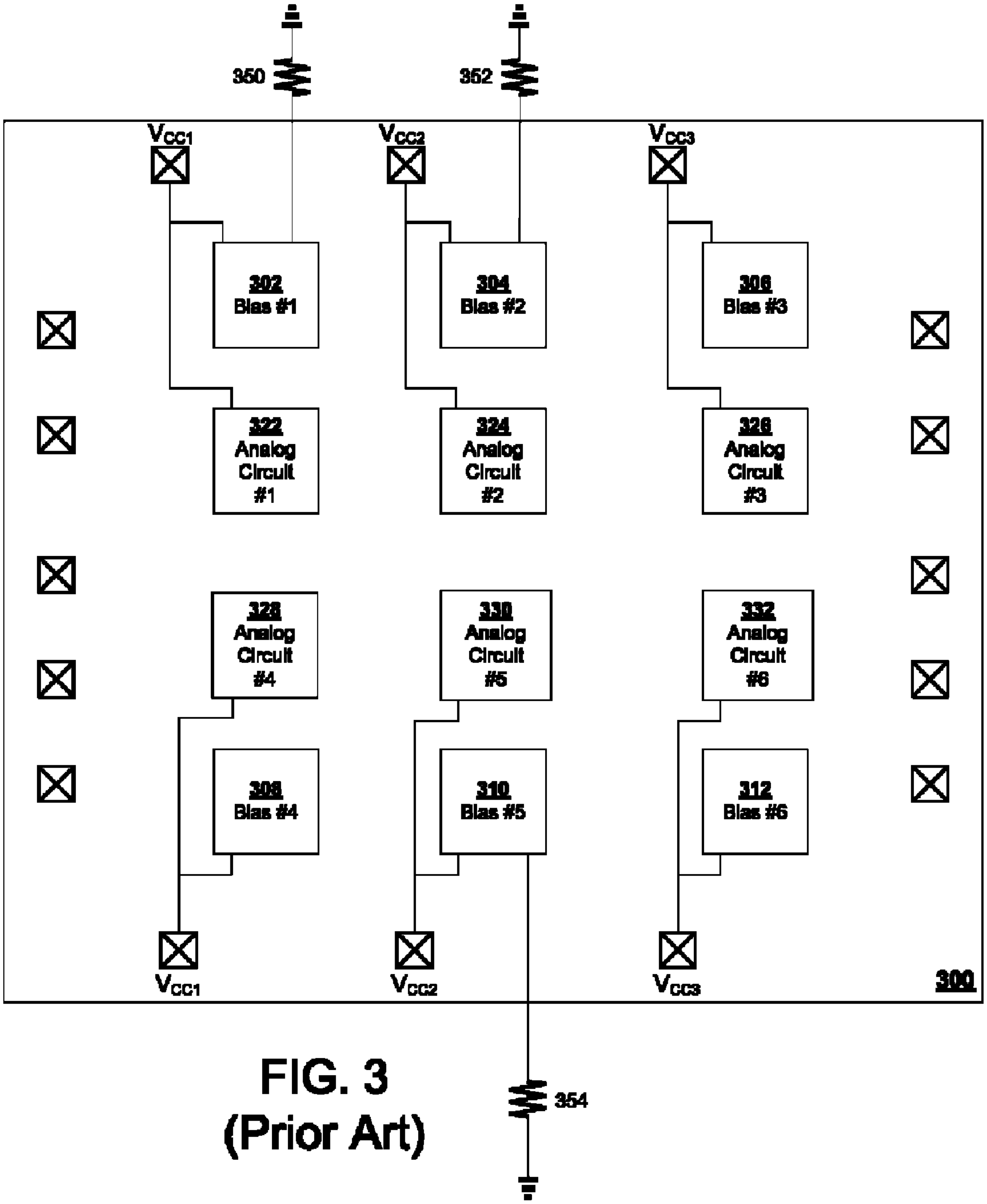
FIG. 3 (Prior Art)
FIG. 3 depicts an example of the hybrid biasing approach.
Figure 4:
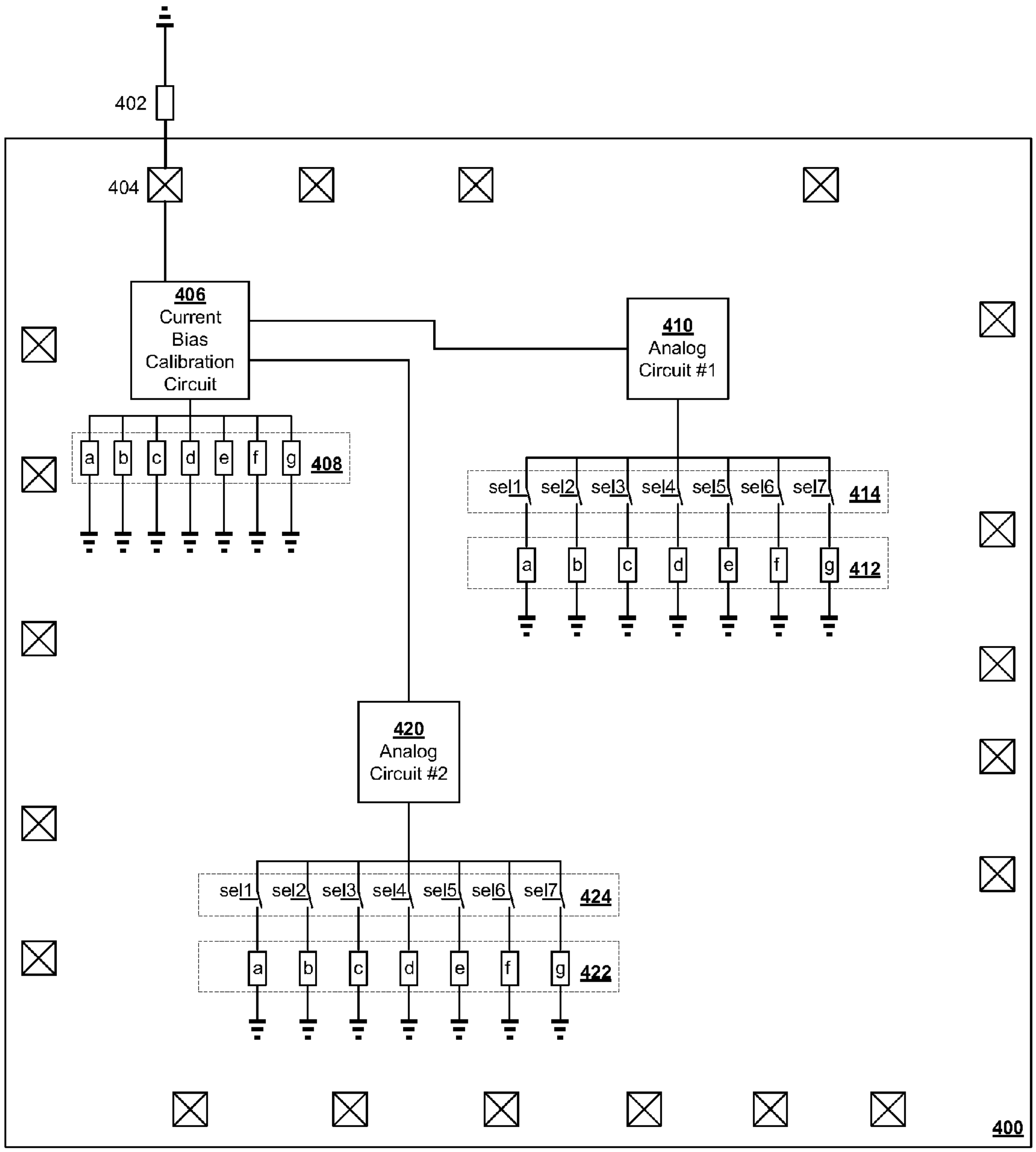
FIG. 4 illustrates a block diagram of a circuit which exploits a single high tolerance external reference component to provide local reference to a plurality of circuits.

FIG. 4 illustrates a block diagram of a circuit which exploits a single high tolerance external reference component to provide local reference to a plurality of circuits. External reference component 402 is connected to chip 400 through pin 404. Calibration circuit 406 is coupled to pin 404 and compares it to a plurality of components 408 each manufactured with slightly different values. Calibration circuit 406 matches one of the plurality of components to external reference component 402 whose characteristics best matches. The calibration circuit then transfers that information to at least one analog circuit 410 which requires this reference. Analog circuit 410 selects from a corresponding component in plurality of components 412, perhaps using a plurality of switches such as switches 414. Also, shown in the figure another analog circuit 420 with plurality of components 422 using plurality of switches 424. Furthermore, after the calibration is completed and any analog circuit requiring the use of the reference component has obtained the correct reference component from the calibration circuit. The results can be latched by analog bias circuit 410 and the calibration circuit can be shut off to save power.

In the specific example given, the reference component used is a 10-kΩ resistor. External reference component 402 is a 10-kΩ resistor. Suppose calibration circuit 406 determines that resistor 408*c*, which was manufactured as a 9.5-kΩ resistor, actually matches the 10-kΩ external resistor. Calibration circuit 406 sends a signal to analog circuit 410 to select resistor 412*c*. Similarly, calibration circuit 406 can also send a signal to analog circuit 420 to select resistor 422*c*. It should be noted that resistor 408*c* need not match the external reference component. As later demonstrated below, the resistor 408*c* might be on a different scale completely but rely on the external reference component to provide a consistent reference voltage or current. For example, using a 10-kΩ resistor calibration circuit 406 may have a reliable 100 μA current which can be used to test the plurality of components. Suppose the desired internal component is a 12-kΩ resistor, then the calibration circuit chooses the resistor which exhibits 1.2V when the 100 μA is drawn through it.

Figure 5:
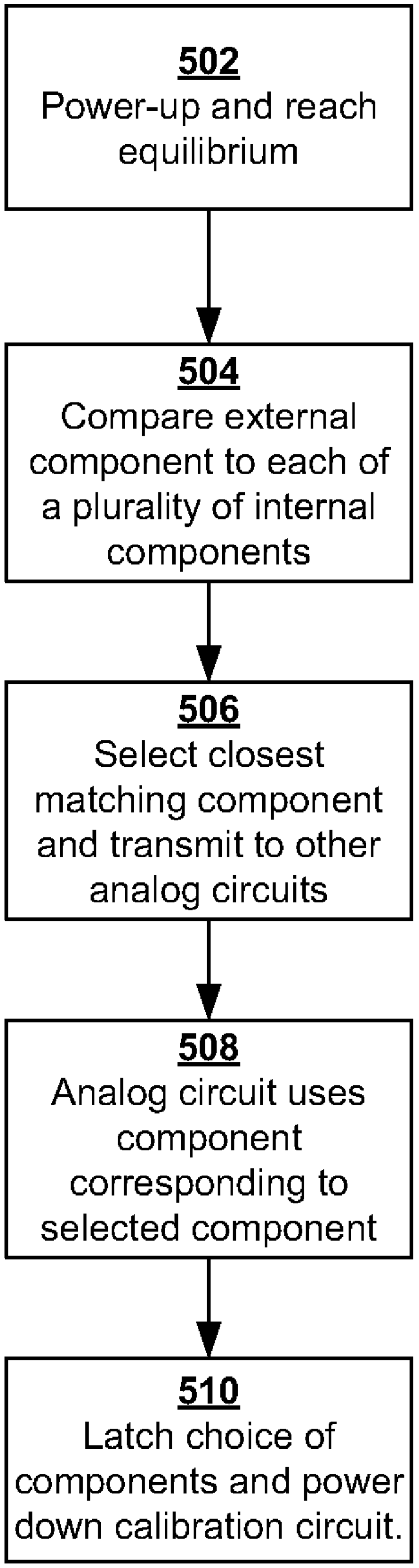
FIG. 5 illustrates a general method by which the circuits of FIG. 4 operate.

FIG. 5 illustrates a general method by which the circuits operate. At step 502, the circuit waits until it reaches an equilibrium after powering up. This is to insure that factors such as temperature do not alter the comparison of the external component and the plurality of components. At step 504, the calibration circuit compares an external component to one of a collection of on-chip components and the on-chip component best matching the desired characteristics of the external component is selected. At step 506, the selection of this on-chip component is transmitted to all the other analog circuits requiring a reference, e.g. a bias circuit. Each analog circuit can then select the corresponding on-chip component to the selected on-chip component. At step 508, the selected corresponding on-chip component is then used for reference by the analog circuit. At step 510, the choice of on-chip components is latched and the calibration circuit is powered down. In the specific example of FIG. 4, the external component is an off-chip resistor and the desired characteristic of the resistor is 10-kΩ of resistance.

Though the chip and algorithm described above, select a single on-chip component most closely matching the characteristics of the reference external component, one could select more than one on-chip component to better match the reference external component. For example, if the external resistance lies between the resistance of resistor 408*e* and 408*f*, both may be selected yielding a resistance that is the harmonic average of the two resistances. One of ordinary skill in the art could develop new algorithms employing the selection of multiple components.

The remainder of the disclosure illustrates the above concept in the context of current bias circuits and the use of resistors as the reference components, but it should be understood that the invention is applicable to other types of circuits, such as voltage bias circuits, and other reference components that would be apparent to one of ordinary skill in the art.

A specific implementation of the general design is described. It should be noted that while the description is given in terms of very specific details, such as the use of polysilicon resistors, these details are given for the sake of example and should not be taken to limit the invention as described.

Figure 6:
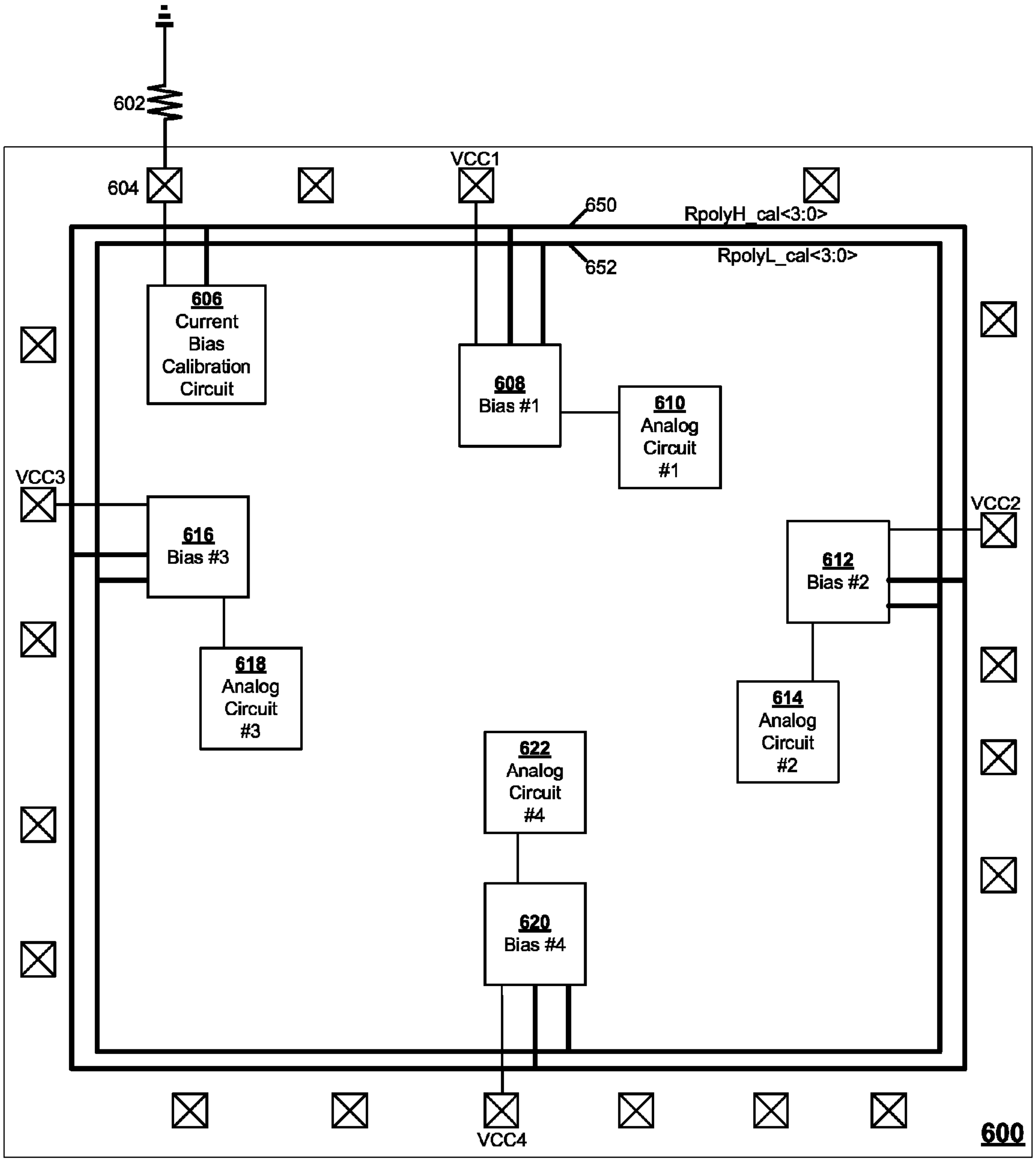
FIG. 6 is an example floor plan of a highly integrated RF or analog chip that includes the global bias calibration circuit.

FIG. 6 is an example floor plan of a highly integrated RF or analog chip that includes the global bias calibration circuit. The bias calibration circuit is pictured in the upper left corner of the die; however it can be located in whichever location is best for a custom floor plan. Package pin 604 is a single pin reserved for the calibration circuit. High precision, off-chip resistor 602 is connected to pin 604. The perimeter of the floor plan, just inside the pad ring, contains two pair of buses 650 and 652 of four signals carrying the calibration codes for two polysilicon resistors. Calibration bus 650 is also labeled RPolyH_CAL, corresponding to a high sheet resistance polysilicon resistor, and calibration bus 652 is also labeled RPolyL_CAL corresponding to a low sheet resistance polysilicon resistor. The individual, customized local bias circuits for each of analog circuits 610, 614, 618 and 622 are bias circuits 608, 612, 616, and 620, respectively. Each of these bias circuits reads the appropriate resistor calibration code from the RPolyH_CAL or RPolyL_CAL calibration buses. The bias circuit then uses these digital codes to calibrate the bias resistance and bias current close to the nominal value. The accuracy of the calibration matches the tolerance of the high precision off-chip resistor. The calibration codes, which are routed globally, are digital and therefore, they are not sensitive to common mode noise disturbances. In this way, the calibration is achieved globally across the full chip without coupling any noise between different analog circuits through the separate supply domains or the local bias circuits.

Figure 7:
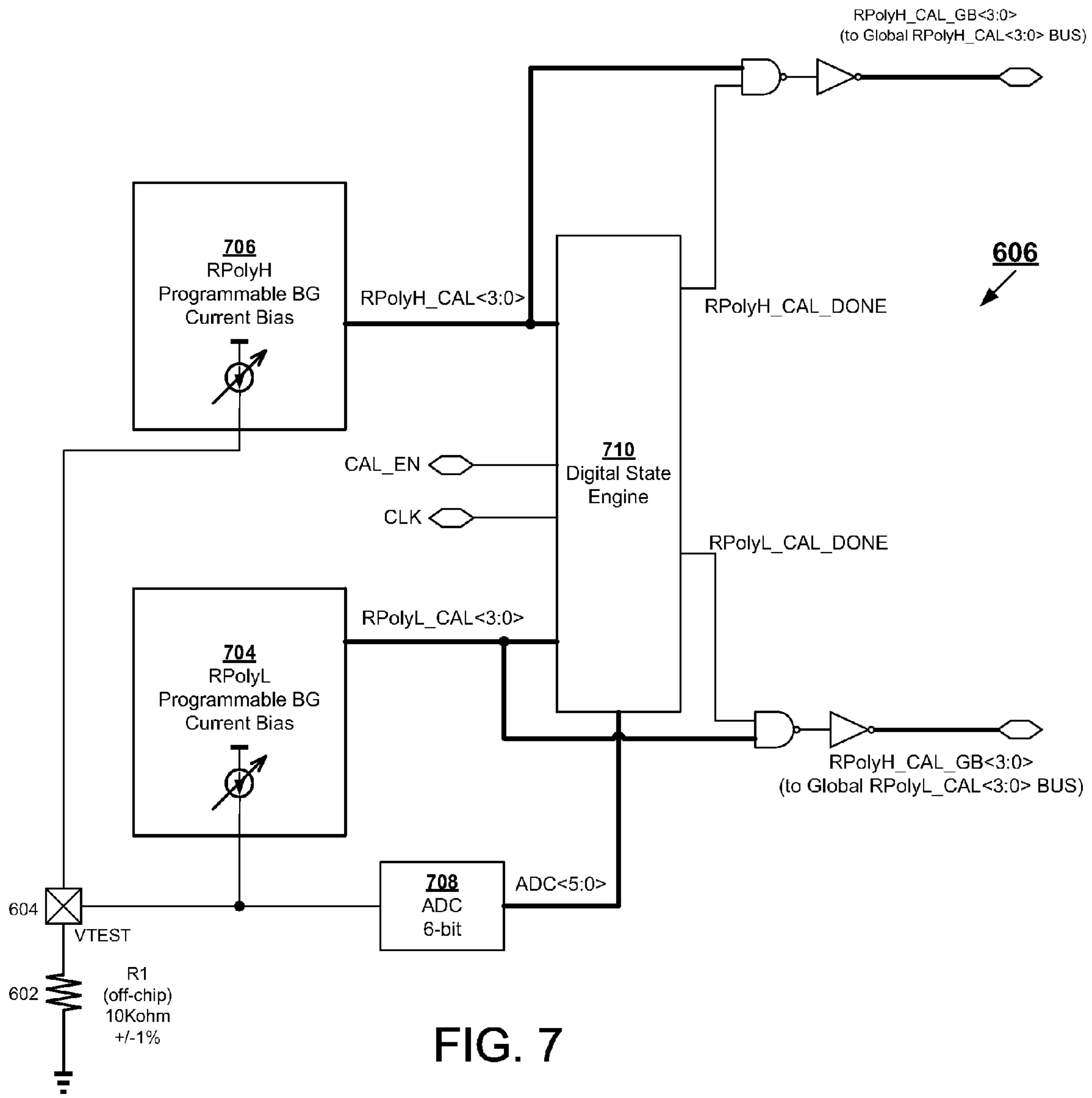
FIG. 7 illustrates a block diagram of the global bias calibration circuit.

FIG. 7 illustrates a block diagram of the global bias calibration circuit. The architecture comprises programmable bandgap current source 704 and programmable band gap current source 706 referenced to two different on-chip resistor types. For one particular process, these are the high sheet resistance polysilicon resistor, RPolyH, and the low sheet resistance polysilicon resistor, RPolyL. The current from each of these programmable bandgap current sources is connected to high precision off-chip resistor 602 also labeled R1, through the package pin 604 which is also labeled VTEST. Digital state engine 710 sequences through a calibration algorithm which can be run at power up or after an SPI write to initiate the algorithm. This algorithm is shown in the flow chart in FIG. 9 and is described in more detail below. Six-bit ADC 708 compares the voltage at pin 604 to a set of reference voltages defined by an on-chip bandgap reference, and produces a representative digital code, ADC<5:0>. This digital code is processed by digital state engine 710 and used to generate a sequence of trial calibration codes. The calibrated values, RPolyH_CAL_GB<3:0> and RPolyL_CAL_GB<3:0>, are the final calibration values and they are enabled by digital state engine 710 when the calibration algorithm is complete. The two signals RPolyH_CAL_DONE and RPolyL_CAL_DONE release the final calibrated values to the global resistor calibration bus, which is accessible to the full chip.

Figure 8:
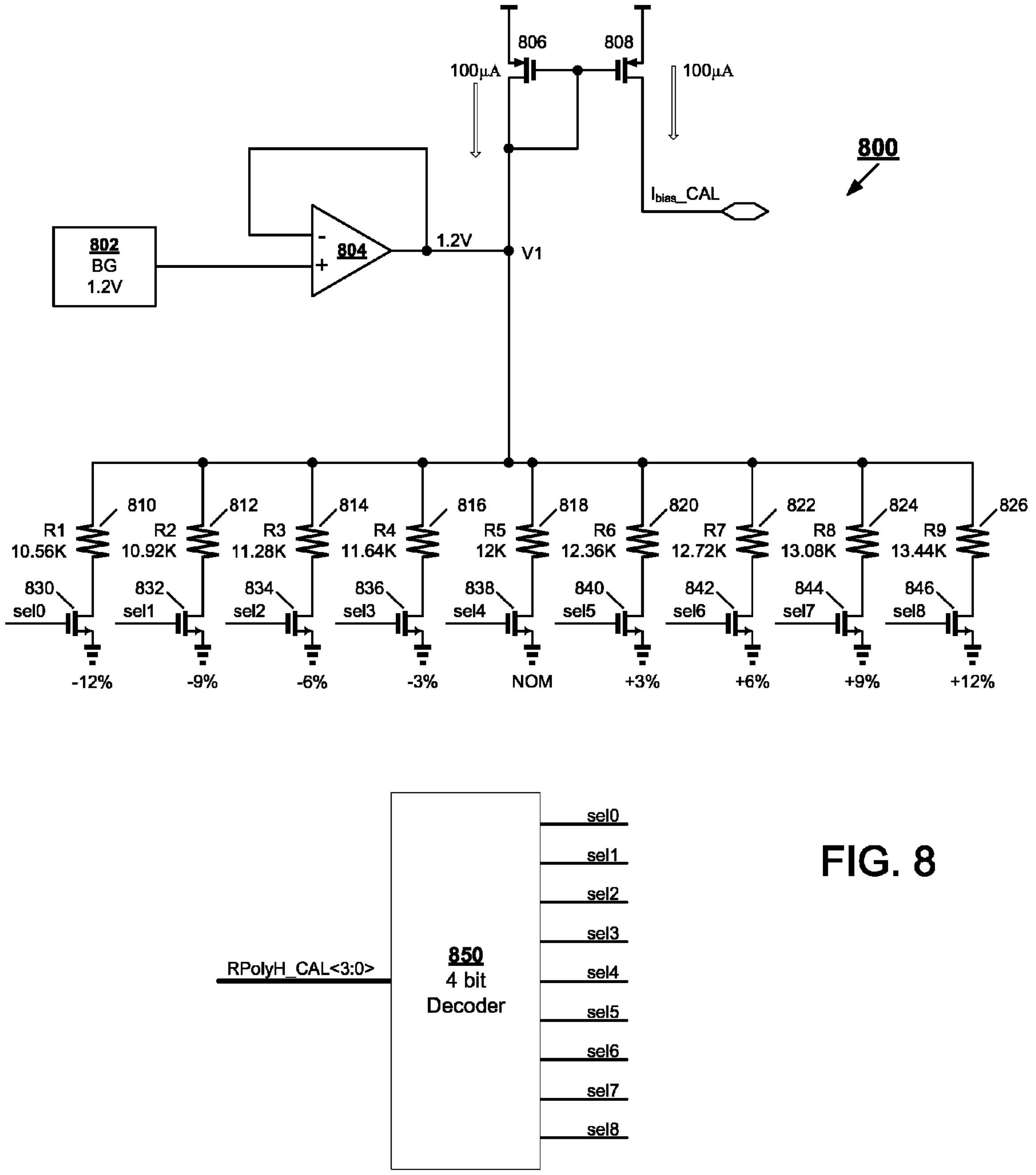
FIG. 8 shows a detailed schematic of the implementation of the each programmable band-gap current source.

FIG. 8 shows a detailed schematic of the implementation of the each programmable band-gap current source such as programmable band-gap current source 704 and 706. Current source 800 consists of 1.2V bandgap voltage reference 802 which is independent of supply voltage, process, and temperature. This voltage is buffered by operational amplifier 804 with unity gain feedback copying the bandgap voltage to node V1. This node is then connected to an array of parallel resistors, each with a series switch. Resistors 810, 812, 814, 816, 818, 820, 822, 824, and 826 are in series with switches 830, 832, 834, 836, 838, 840, 842, 844, and 846, respectively. All of the resistors are implemented with the same resistor type, which is RPolyH in one implementation. The nine resistors all have resistance values that each differ by a small percentage covering a full range of +/−12%, which matches the sheet resistance tolerance for an RPoly resistor in a typical silicon process. The PMOS current mirror consisting of transistors 806 and 808 copies the current generated by the bandgap voltage over the resistance and mirrors it over to the output $I_{bias}$_CAL (in a RPolyH programmable band gap current source, this is labeled I_RPH_bias, and in a RPolyL programmable band gap current source, this is labeled I_RPL_bias). $I_{bias}$_CAL is then connected to package pin 604. A test voltage is generated at package pin 604 when this current is turned ON and connected to high precision, off-chip resistor 602 as shown in FIG. 7. The same topology is used for the RPolyL programmable band gap current source when all of the RPolyH resistors are replaced with RPolyL resistors. It should be noted that in this example, the reference resistor is 10-kΩ, but the desired internal resistor is a 12-kΩ resistor.

Figure 9:
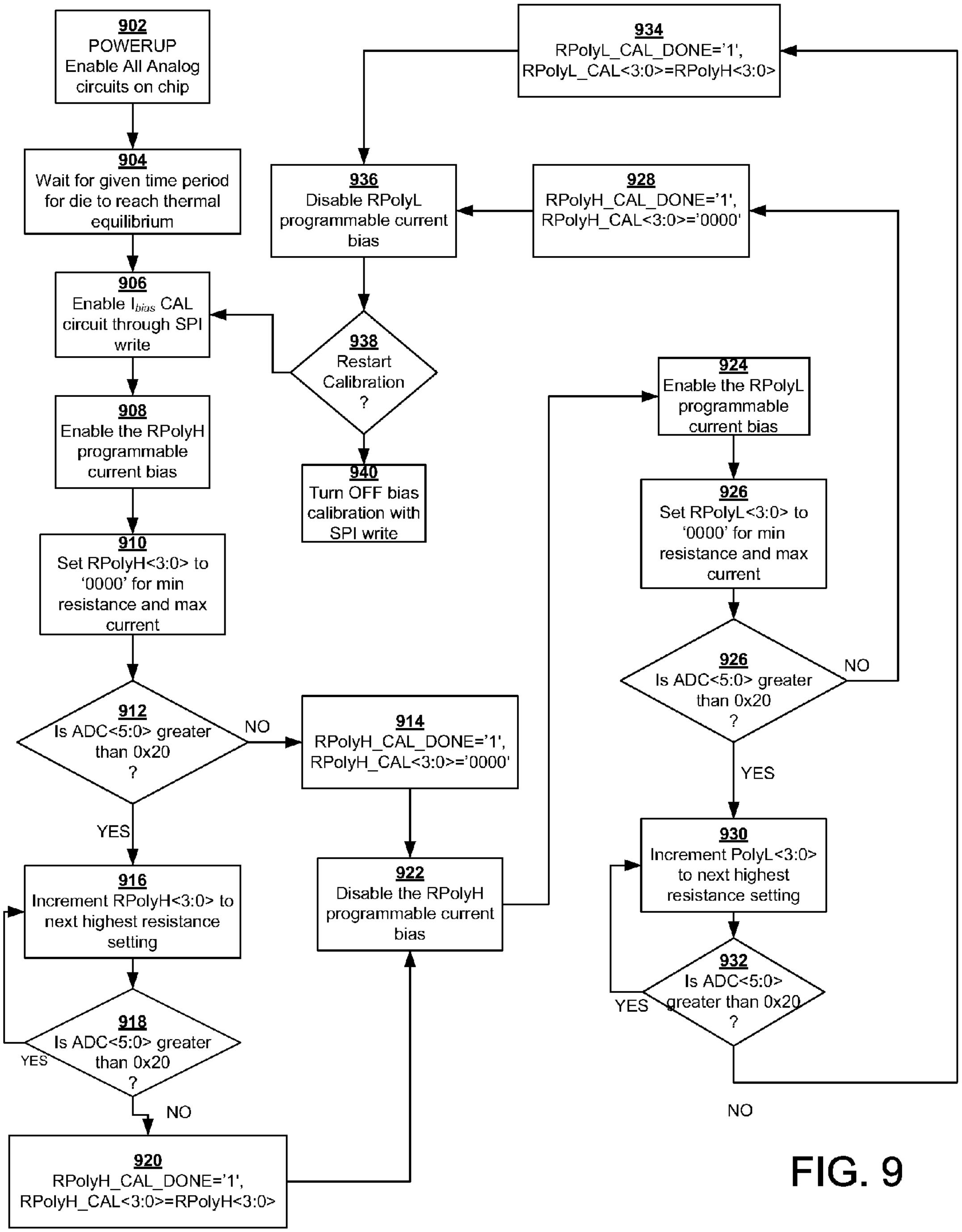
FIG. 9 illustrates a detailed flow chart of the calibration algorithm as implemented in the digital state engine.

FIG. 9 illustrates a detailed flow chart of the calibration algorithm as implemented in digital state engine 710. The digital state engine algorithm is used to generate the RPolyH_CAL and RPolyL_CAL calibration codes as shown in the decoder table of FIG. 13. For example, when the sheet resistance of the RPolyH resistors for a particular die is at 9% above the nominal value as a result of process variation, the algorithm finds the calibration code RPolyH_CAL<3:0>=‘0111.’ This 4-bit code can then be decoded by each local bias circuit and mapped to select a programmable resistance value to calibrate out the process variation.

The calibration algorithm first begins by powering up and letting the chip settle into a state of equilibrium. More specifically, at step 902, the power up of the chip begins and all circuits are activated. At step 904, the chip is allowed to reach a thermal equilibrium. At step 906, calibration circuit 606 is activated with a serial peripheral interface (SPI) write.

The algorithm then determines which RPolyH resistor has essentially the same resistance as reference resistor 602. Specifically, at step 908, RPolyH programmable bias current source 706 is turned on and RPolyL programmable bias current source 704 is shut off. This current is then fed to the package pin 604 into high precision off-chip resistor 602. Digital state engine 710 expects the VTEST voltage to be about 1.2V which corresponds to the nominal resistance value 10 kΩ. For an unknown tolerance on the resistance for a particular die, state engine 710 begins at step 910 by setting the RPolyH<3:0> setting to ‘0000’ for the minimum resistance. The programmable bias current source then selects the resistor corresponding to minimum resistance and maximum current (for example if FIG. 8 is the RPolyH programmable bias current source, resistor 810 is selected). ADC 708 closes a digital feedback loop by converting the measured voltage to a corresponding digital code, ADC<5:0>. State engine 710 then compares this value to the desired value of ‘0x20,’ which represents the nominal resistance at step 912. If the measured value of the VTEST voltage is less than the desired value (that is the value of ADC<5:0> is less than ‘0x20’), the calibration procedure ends and the resistance setting is latched in as the calibration value at step 914. If the measured value is greater than the desired value, state engine 710 increments the resistance setting at step 916, which decrements the bias current following a successive approximation algorithm. At step 918, state engine 710 then compares the VTEST voltage value to the desired value of ‘0x20,’ which represents the nominal resistance. If the measured value of the VTEST voltage is less than the desired value, the calibration procedure ends and the resistance setting is latched in as the calibration value at step 920; otherwise, the process repeats at step 916. When the VTEST voltage falls below the desired value, the state machine latches the calibration code by pulling RPolyH_CAL_DONE high at either step 914 or step 920. With the calibration for RPolyH resistance complete, PolyH programmable current source 706 is turned off at step 922.

The algorithm then determines which RPolyL resistor has essentially the same resistance as reference resistor 602. The process is similar to that of the preceding steps. Specifically, at step 924, RPolyL programmable bias current source 704 is turned on and RPolyH programmable bias current source 706 is shut off. This current is then fed to the package pin 604 into high precision off-chip resistor 602. At step 926, the state engine 710 sets the RPolyL<3:0> setting to ‘0000’ for the minimum resistance. The programmable bias current source then selects the resistor corresponding to minimum resistance and maximum current (for example if FIG. 8 is the RPolyL programmable bias current source, resistor 810 is selected). ADC 708 closes a digital feedback loop by converting the measured voltage to a corresponding digital code, ADC<5:0>. State engine 710 then compares this value to the desired value of '0x20,' which represents the nominal resistance at step 926. If the measured value of the VTEST voltage is less than the desired value (that is the value of ADC<5:0> is less than '0x20'), the calibration procedure ends and the resistance setting is latched in as the calibration value at step 928. If the measured value is greater than the desired value, state engine 710 increments the resistance setting at step 930, which decrements the bias current following a successive approximation algorithm. At step 932, state engine 710 then compares the VTEST voltage value to the desired value of '0x20,' which represents the nominal resistance. If the measured value of the VTEST voltage is less than the desired value, the calibration procedure ends and the resistance setting is latched in as the calibration value at step 934; otherwise, the process repeats at step 930. When the VTEST voltage falls below the desired value, the state machine latches the calibration code by pulling RPolyL_CAL_DONE high at either step 928 or step 934. With the calibration for RPolyL resistance complete, PolyL programmable current source 706 is turned off at step 936.

The calibration algorithm can be restarted if conditions, such as temperature, change at step 938. The process can go back to step 906. However, if calibration is not restarted, bias circuit 606 can be shut off with an SPI write at step 940.

Figure 10:
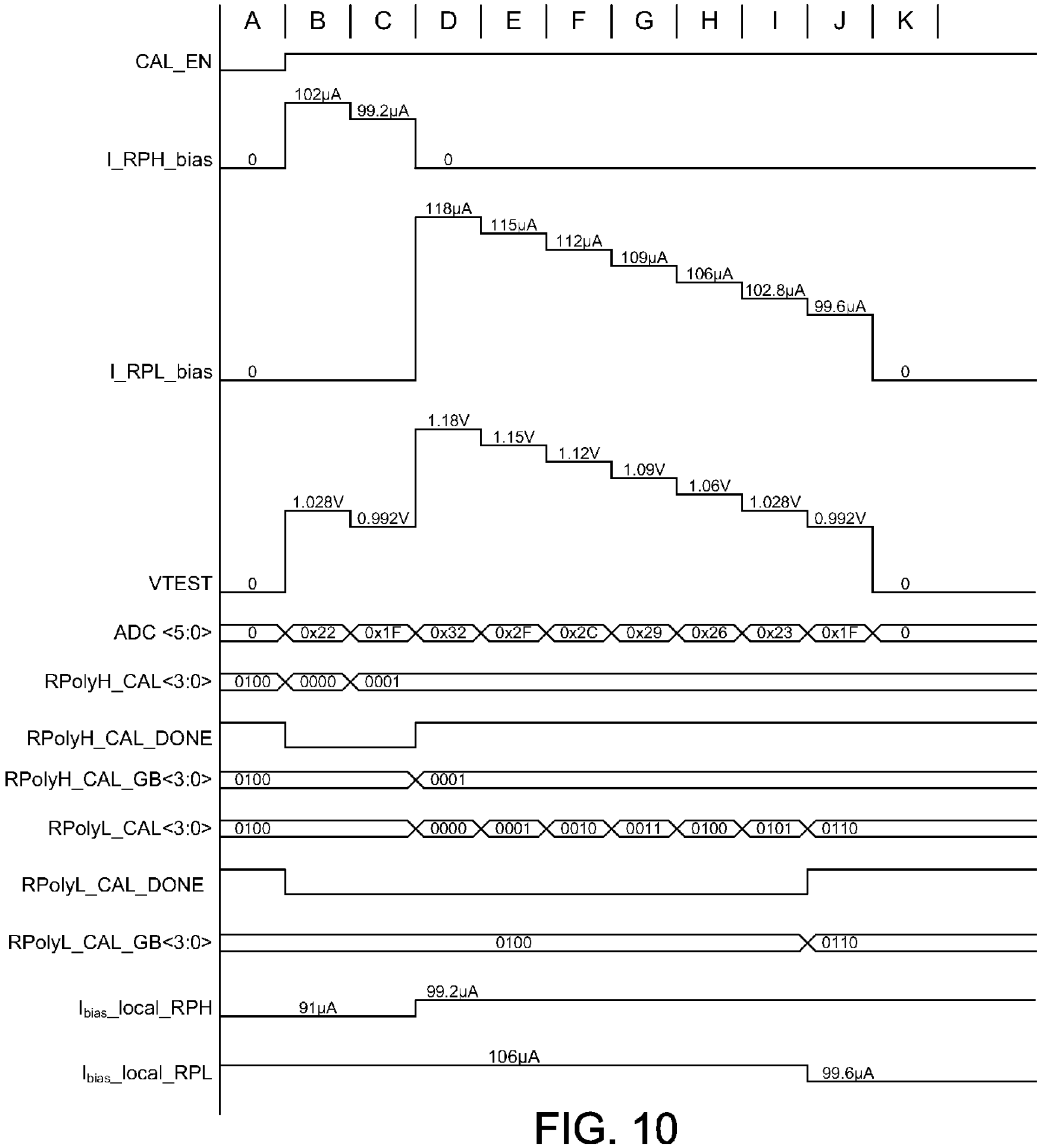
FIG. 10 is an example timing diagram of the resistor calibration sequence for a particular die.

FIG. 10 is an example timing diagram of the resistor calibration sequence for a particular die. The example device has an RPolyH sheet resistance 9% above the nominal value and an RPolyL resistance 6% below the nominal value. On power-up the calibration circuit is off and the global resistor calibration buses, RPolyH_CAL_GB<3:0> and RPolyL_CAL_GB<3:0>, hold a reset value equivalent to the nominal resistance calibration setting of '0100.' The calibration circuit is enabled and the algorithm begins when CAL_EN is pulled high through SPI write cycle, shown at the end of time period A. The RPolyH programmable BG bias circuit is turned on at the beginning of time period A with the bias resistor set to RPolyH<3:0>='0000' corresponding to the minimum resistance. This corresponds to a bias current of 102 μA. This current is above the desired value of 100 μA corresponding to the nominal case. Therefore, the VTEST voltage is 1.028V, which is also above the desired value. The ADC converts this voltage to a corresponding digital hexadecimal value of '0x22 following the ADC mapping table shown in FIG. 11. State engine 710 reads this ADC code and compares it to the desired value of '0x20,' representing the nominal value. Since the measured voltage is above the desired value, state engine 710 increments the calibration resistance by setting RPolyH_CAL<3:0> to '0001' which incrementally reduces the bias current. The I_RPH_bias current is now 99.2 μA at the beginning of time period C and the VTEST voltage has gone down to 0.992V. The ADC reads the new input voltage and produces a corresponding output code of '0x1F.' The state machine compares '0x1F' to the desired '0x20' and determines that the bias current has now dropped just below the desired nominal value. Calibration of the RPolyH resistors is then completed when the state machine pulls RPolyH_CAL_DONE high and latches the RPolyH_CAL<3:0> value onto the RPolyH_CAL_GB<3:0> bus. The bias current at a local bias circuit using RPolyH resistor ($I_{bias_}$local_RPH) then increases from its uncompensated value of 91 μA to 99.2 μA at the end of time period C. At the end of time period C, the state machine shuts off the RPolyH programmable bias circuit and I_RPH_bias drops to zero. At the same time, the state machine turns on the RPolyL programmable bias circuit and I_RPL_bias jumps up to its maximum value of 118 μA. From time period D through time period J, the state machine repeats the successive approximation algorithm for the RPolyL resistance. Afterwards, the calibration value is latched onto the RPolyL_CAL_GB<3:0> global bus and both local bias currents are fully calibrated. The decoder in the local bias circuit reads the RPolyL_CAL_GB<3:0> code and selects its bias resistance such that the bias current at a local bias circuit using RPolyL resistor ($I_{bias_}$local_RPL) current jumps from 106 uA down to 99.6 uA. At the end of the calibration procedure, both programmable bias current sources, I_RPH_bias and I_RPL_bias are turned off and their currents drop to zero. At the same time the VTEST voltage drops to zero and all of the calibration circuits other than state engine 710 are turned off including the ADC. In this way, the steady state current after the calibration algorithm is complete is zero.

FIG. 11 shows an example mapping table for the 6-bit ADC. The full scale range of the converter is 630 mV and is centered around an input voltage of 1V, which corresponds to the voltage on package pin 604 under nominal conditions. The 6-bit resolution is equivalent to 10 mV and the full scale range is centered on the desired input voltage range.

Figure 12:
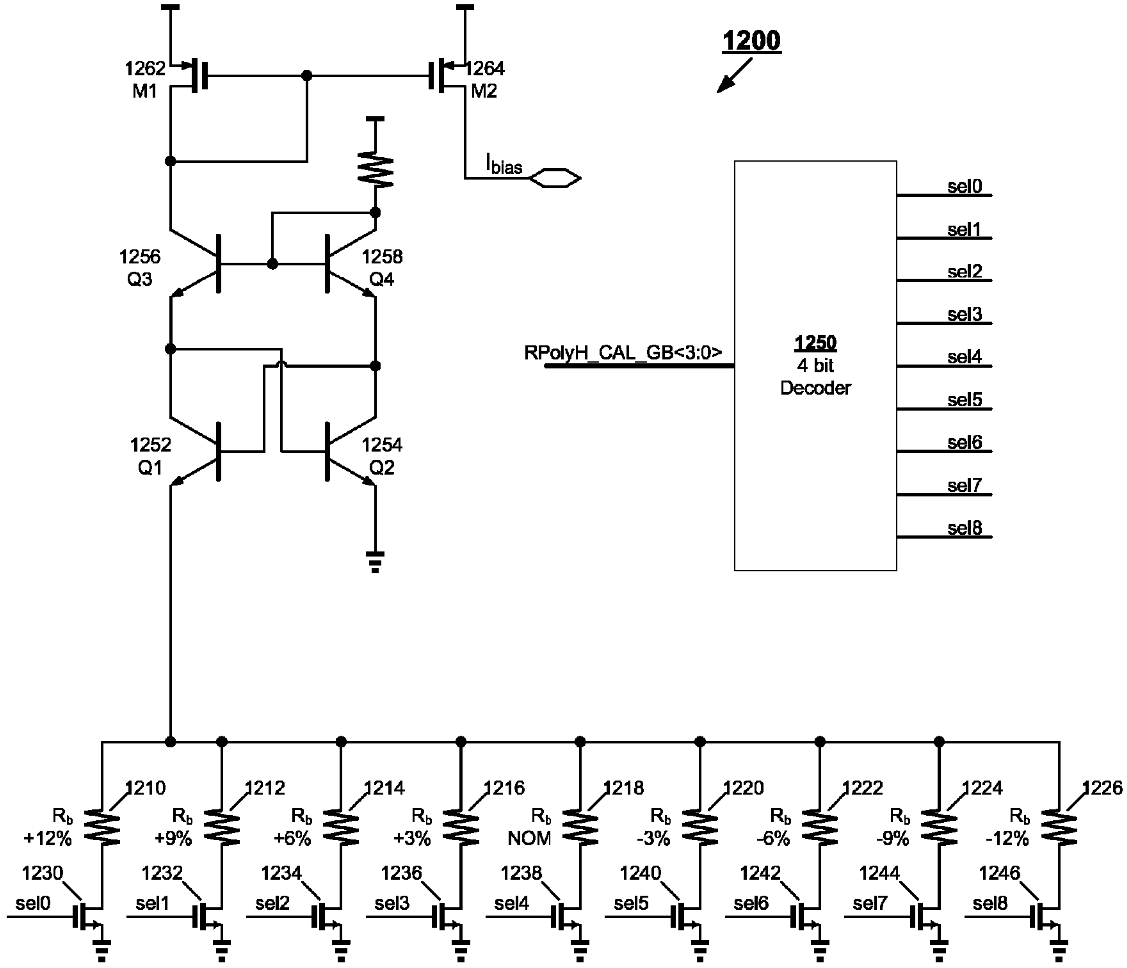
FIG. 12 shows an example local bias circuit as the PTAT bias circuit.

An example local bias circuit is shown as the PTAT bias in FIG. 12. Cross coupled NPN transistors 1252 (Q1), 1254 (Q2), 1256(Q3), and 1258 (Q4) establish a $\Delta V_{BE}$ voltage across the bias resistor array comprising resistors 1210, 1212, 1214, 1216, 1218, 1220, 1222, 1224, and 1226, creating a PTAT current through transistor 1262(M1). This PTAT current is then copied over to the current source 1264 (M2) by the PMOS current mirror. The resistor array and decoder 1250 enable calibration of the PTAT bias circuit when the circuit is programmed with the calibration codes from the global bias calibration circuit. These codes are easily accessible to each local bias circuit in the full chip by connecting to the RPoly calibration bus as shown in FIG. 6.

FIG. 13 shows an example decoder mapping table for each local bias circuit. Each RPolyH<3:0> code corresponds to an equivalent measured sheet resistance tolerance. The nominal value corresponds to '0100.' The decoder within each local bias circuit maps this input code to select an appropriate programmable resistor from the array shown in FIG. 12 to bring the actual resistance back to the nominal value. In the example case shown in FIG. 10, the RPolyH sheet resistance was measured to be 9% above the nominal value. Therefore, the bias circuit decoder selects the $R_b$-9% resistor from the parallel resistor array to bring the effective resistance back to the nominal value in the presents of process variation.

The solution provided here can also be expanded to produce precise transconductances for GmC filters and precise reference voltage/current for op amps and data converters, and henceforth to make these analog/mixed-signal circuits less dependent on process variation. The GmC filter using precise control of bias currents can provide accurate control of poles for accurate frequency response. Op amps designed using the solution provided here for precise bias current can make the open-loop gain and phase margin well controlled in the target region so robust and high gain and large unit gain bandwidth (UBW) op amps can be achieved. Precise reference voltages/currents provided by this solution minimize the SNR degradation of analog-to-digital converters due to reference errors and large gain/UBW variations of op amps.

The solution offered here can be used to minimize the current variation due to process, voltage, and temperature. In this way, the worst case power dissipation for the chip is very close to the nominal power dissipation under all PVT conditions. The result is a 10-15% lower power budget for the chip, which is a significant improvement for extremely low power applications such as USB and battery powered devices. The chip would only require one high precision (≦+/−1%) off-chip resistor with a flexible pin location for this resistor with no effect on the noise performance of the analog circuits within chip. Because the calibration takes place during the power-up sequences the calibration codes can be latched and calibration circuit powered off, hence no additional steady state power consumption is added. The chip is self calibrating requiring no operation to be performed in the factory or no non-volatile memory to store calibration codes. Other advantages of this solution would no doubt be apparent to one of ordinary skill in the art.

Furthermore, the applications of this solution have great applicability in tuners with extremely low power dissipation in a wide range of applications including cable, satellite, and terrestrial TV. The solution is applicable in any analog, RF, or mixed-signal IC products in which multiple bias circuits are used for biasing different circuit blocks within the IC. This solution is also applicable in many different semiconductor process technologies and feature sizes, including CMOS, BiCMOS, and Bipolar. Additional applications would no doubt be apparent to those of ordinary skill in the art.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed:

1. An integrated circuit comprising:

a calibration circuit having a first plurality of internal components; and an analog circuit having a second plurality of internal components, wherein the calibration circuit compares a value corresponding to each component in the first plurality of internal components to an external reference and selects a best matching selected component in the first plurality of internal components; the calibration circuit communicates the selection of the selected component to the analog circuit; and the analog circuit uses a component in the second plurality of internal components corresponding to the selected component.

2. The integrated circuit of claim 1, wherein each of the first plurality of internal components is a resistor, each of the second plurality of internal components is a resistor; and the external reference is a high tolerance resistor.

3. The integrated circuit of claim 1, wherein each of the first plurality of internal components is a high sheet resistance polysilicon resistor, each of the second plurality of internal components is a high sheet resistance polysilicon resistor; and the external reference is a high tolerance resistor.

4. The integrated circuit of claim 1, wherein each of the first plurality of internal components is a low sheet resistance polysilicon resistor, each of the second plurality of internal components is a low sheet resistance polysilicon resistor; and the external reference is a high tolerance resistor.

5. The integrated circuit of claim 4, further comprising another analog circuit having a third plurality of internal components, wherein the calibration circuit further comprises a fourth plurality of internal components, and wherein each of the third plurality of internal components and each of the fourth plurality of internal components is a low sheet resistance polysilicon resistor.

6. The integrated circuit of claim 1, wherein the calibration circuit comprises:

a programmable current bias circuit;

an analog-to-digital converter; and a digital state engine, wherein the programmable current bias circuit comprises the first plurality of internal components.

7. The integrated circuit of claim 1, wherein the programmable current bias circuit comprising:

the first plurality of internal components;

a plurality of switches each coupled to one of the first plurality of internal components;

a digital decoder coupled to the plurality of switches;

a bandgap voltage reference;

a buffer coupled to the bandgap voltage; and a current mirror coupled to the buffer and to the first plurality of internal components.

8. The integrated circuit of claim 1, wherein the analog circuit is a current bias circuit.

9. The integrated circuit of claim 1, wherein the analog circuit is a band gap referenced bias circuits.

10. The integrated circuit of claim 1, wherein the analog circuit is a low 1/f noise Widlar-based bias circuit.

11. The integrated circuit of claim 1, wherein the analog circuit is a PTAT bias circuit.

12. The integrated circuit of claim 9, wherein the PTAT bias circuit comprises:

NPN transistors in a cross coupled configuration;

the second plurality of internal components;

a plurality of switches each coupled to one of the first plurality of internal components;

a digital decoder coupled to the plurality of switches; and a current mirror coupled to the NPN transistors.

13. A method of providing reference to an analog circuit residing on an integrated circuit comprising:

powering-up the integrating circuit and waiting for the integrated circuit to reach an equilibrium;

comparing an external component to each of a first plurality of internal components by a calibration circuit;

selecting a matching component in the first plurality of internal components by the calibration circuit;

transmitting a label representative of the matching component to the analog circuit;

using a component in a second plurality of internal components, the component corresponding the matching component by the analog circuit;

latching the label; and powering down the calibration circuit.

14. The method of claim 13, wherein each of the first plurality of internal components is a resistor, each of the second plurality of internal components is a resistor, and the external reference is a high tolerance resistor.

15. The method circuit of claim 13, wherein each of the first plurality of internal components is a high sheet resistance polysilicon resistor, each of the second plurality of internal components is a high sheet resistance polysilicon resistor, and the external reference is a high tolerance resistor.

16. The method circuit of claim 13, wherein each of the first plurality of internal components is a low sheet resistance polysilicon resistor, each of the second plurality of internal components is a low sheet resistance polysilicon resistor, and the external reference is a high tolerance resistor.

17. The method of claim 13, wherein the analog circuit is a current bias circuit.

18. The method of claim 17, wherein the analog circuit is a PTAT bias circuit, a band gap referenced bias circuits or a low 1/f noise Widlar-based bias circuit.

* * * * *